United States Patent
Park

(10) Patent No.: US 9,013,923 B2
(45) Date of Patent: Apr. 21, 2015

(54) SEMICONDUCTOR DEVICE AND OPERATING METHOD THEREOF

(75) Inventor: Young Soo Park, Seoul (KR)

(73) Assignee: SK Hynix Inc., Gyeonggi-do (KR)

(*) Notice: Subject to any disclaimer, the term of this patent is extended or adjusted under 35 U.S.C. 154(b) by 335 days.

(21) Appl. No.: 13/605,955

(22) Filed: Sep. 6, 2012

(65) Prior Publication Data

US 2013/0070529 A1   Mar. 21, 2013

(30) Foreign Application Priority Data

Sep. 20, 2011 (KR) .................. 10-2011-0094559

(51) Int. Cl.
G11C 16/06 (2006.01)
G11C 16/10 (2006.01)
G11C 16/28 (2006.01)

(52) U.S. Cl.
CPC .............. G11C 16/10 (2013.01); G11C 16/28 (2013.01)

(58) Field of Classification Search
CPC ............................... G11C 16/10; G11C 16/28
USPC .............. 365/185.2, 185.11, 185.25, 185.17, 365/185.29
See application file for complete search history.

(56) References Cited

U.S. PATENT DOCUMENTS

| | | | | |
|---|---|---|---|---|
| 2009/0244967 A1* | 10/2009 | Kim et al. | ... | 365/185.2 |
| 2009/0251971 A1* | 10/2009 | Futatsuyama | ... | 365/185.22 |
| 2010/0238729 A1* | 9/2010 | Lee et al. | ... | 365/185.11 |
| 2011/0063917 A1* | 3/2011 | Shiino et al. | ... | 365/185.17 |
| 2011/0110153 A1* | 5/2011 | Dutta et al. | ... | 365/185.03 |
| 2011/0188313 A1* | 8/2011 | Higashitani | ... | 365/185.17 |
| 2012/0327713 A1* | 12/2012 | Parat et al. | ... | 365/185.17 |

FOREIGN PATENT DOCUMENTS

| KR | 1020060101643 | 9/2006 |
|---|---|---|
| KR | 1020080078529 | 8/2008 |

OTHER PUBLICATIONS

Notice of Allowance issued by the Korean Intellectual Property Office on Dec. 16, 2012.

* cited by examiner

*Primary Examiner* — Toan Le
(74) *Attorney, Agent, or Firm* — IP & T Group LLP

(57) ABSTRACT

A method of operating a semiconductor device includes programming one of a drain dummy cell and a source dummy cell which are included in a cell string; and coupling a bit line to the cell string in response to program states of the drain dummy cell and the source dummy cell and a voltage level applied to a drain dummy line coupled to a gate of the drain dummy cell and a source dummy line coupled to a gate of the source dummy cell.

24 Claims, 3 Drawing Sheets

FIG. 3
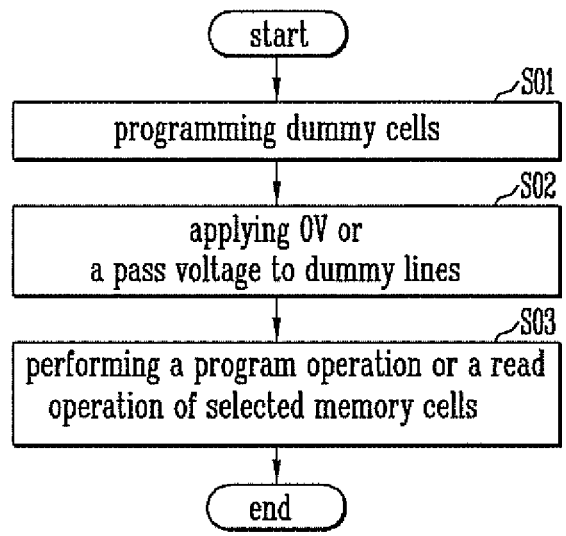
FIG. 4
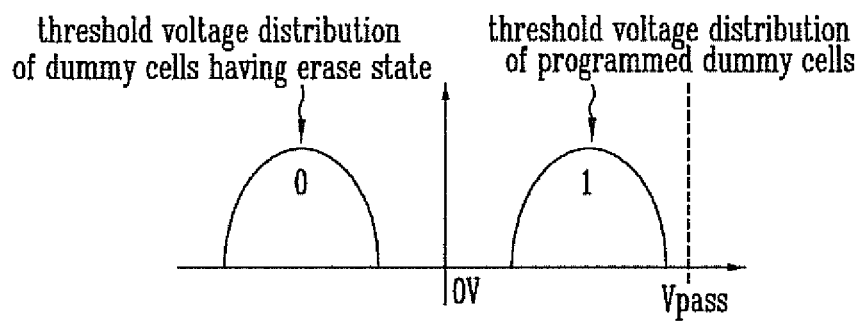
FIG. 5
| | dummy cell | DATA | STe selection | STo selection |
|---|---|---|---|---|
| first embodiment | DDCe | 0 | DDWL=0V | DDWL=Vpass |
| | DDCo | 1 | | |
| | SDCe | 1 | SDWL=Vpass | SDWL=0V |
| | SDCo | 0 | | |
| second embodiment | DDCe | 1 | DDWL=Vpass | DDWL=0V |
| | DDCo | 0 | | |
| | SDCe | 0 | SDWL=0V | SDWL=Vpass |
| | SDCo | 1 | | |

SEMICONDUCTOR DEVICE AND OPERATING METHOD THEREOF

CROSS-REFERENCE TO RELATED APPLICATION

This application claims priority from Korean Patent Application No. 10-2011-0094559, filed on Sep. 20, 2011, the contents of which are incorporated herein by reference in its entirety.

BACKGROUND

The present invention relates to a semiconductor device and an operating method thereof, and more particularly to a semiconductor device for reducing current consumption using dummy cells and an operating method thereof.

A semiconductor device includes a memory cell array for storing data. The memory cell array has cell blocks. Each of the cell blocks includes cell strings. Each of the cell strings comprises a drain select transistor, memory cells, and a source select transistor coupled in serial. Recently, dummy cells are coupled between the memory cells and the drain or source select transistor to prevent leakage by hot carrier capable of generating in a program operation.

The semiconductor device further includes dummy lines for controlling the dummy cells included in each of the cell strings. Thus, a voltage for controlling the dummy lines is required when the semiconductor device operates. Particularly, when the semiconductor device operates, an operation voltage should be applied to a drain dummy line coupled to drain dummy cells of each of the cell strings to control the drain dummy cells coupled between the memory cells and the drain select transistor. An operation voltage should be provided to a source dummy line coupled to source dummy cells of each of the cell strings to control the source dummy cells coupled between the memory cells and the source select transistor.

As described above, since the dummy cells prevent leakage by the hot carrier, a pass voltage is applied to the drain dummy lines and the source dummy lines. Accordingly, the dummy cells do not involved with an operation such as a program operation, a read operation, or an erase operation. Generally, the pass voltage is in approximately 4.5V in the read operation and about 9V in the program operation. The pass voltage may be set differently according to operational condition of the semiconductor device, but has usually higher voltage level than a supply voltage. Accordingly, much current is consumed if the pass voltage is applied to every dummy line whenever the program operation, the read operation, or the erase operation is performed.

Recently, the number of the cell strings has increased according as the number of the memory cells included in the memory cell array augments. As a result, malfunction of the semiconductor device may occur due to interference between adjoining cell strings. Accordingly, when the program operation, the read operation or the verifying operation is performed, the cell strings are divided into an even cell string group and an odd cell string group. One of the even cell string group and the odd cell string group is selected, and corresponding operation is performed in the selected cell string group. Then, corresponding operation to the other cell string group is performed. In case when even cell strings are selected and odd cell strings are not selected, current path of odd bit lines coupled to the odd cell strings is blocked not to select the odd cell strings. Current paths between page buffers and the odd bit lines are also blocked. This method just blocks the current path between the page buffers and the odd bit lines, for not selecting the odd cell strings. However, the method does not itemize or differentiate operations of the even cell strings and the odd cell strings each other. Accordingly, efficiency of the operation may lower when operating separately the cell strings.

SUMMARY OF THE INVENTION

Exemplary embodiments of the present invention provide a semiconductor device for differentiating each of cell strings by controlling dummy cells included in each of the cell strings according to operational circumstance, and reducing current consumption of the semiconductor device by decreasing a voltage level applied to some of dummy lines coupled to dummy cells.

A method of operating a semiconductor device according to one embodiment of the present invention includes programming one of a drain dummy cell and a source dummy cell which are included in a cell string; and coupling a bit line to the cell string in response to program states of the drain dummy cell and the source dummy cell and a voltage level applied to a drain dummy line connected to a gate of the drain dummy cell and a source dummy line connected to a gate of the source dummy cell.

A method of operating a semiconductor device according to another embodiment of the present invention includes programming an even drain dummy cell and maintaining an even source dummy cell to erase state in an even cell string coupled between an even bit line and a common source line and including a drain select transistor, the even drain dummy cell, memory cells, the even source dummy cell and a source select transistor coupled in serial; maintaining an odd drain dummy cell and an odd source dummy cell to erase state in an odd cell string coupled between an odd bit line and the common source line and including a drain select transistor, the odd drain dummy cell, memory cells, the odd source dummy cell and a source select transistor coupled in serial; and coupling selected cell string to selected bit lines and blocking connection of a cell string not selected and bit lines not selected by applying a ground voltage to a drain dummy line coupled to the even and the odd drain dummy cells or a source dummy line coupled to the even and the odd source dummy cells.

A method of operating a semiconductor device according to still another embodiment of the present invention includes selecting an odd bit line or an even bit line, for one of program and read operations; making dummy cells, coupled to the selected bit lines of the dummy cells, be in an erase state and other dummy cells coupled to unselected bit lines be in program state; and coupling the selected bit lines to selected cell strings and blocking connection between the unselected bit lines and unselected cell strings by applying a ground voltage to a dummy line coupled to the dummy cells.

A semiconductor device according to one embodiment of the present invention includes a control circuit configured to output a program operation signal, a read operation signal or an erase operation signal in response to a command signal and an address; and memory cell blocks including an even and an odd cell strings having a drain select transistor, a drain dummy cell, memory cells, a source dummy cell and a source select transistor coupled in serial, wherein some of the dummy cells are programmed and others of the dummy cells maintain erase state.

A semiconductor device of the present invention may decrease a voltage applied to dummy lines, and thus current consumption of the semiconductor device may reduce when the semiconductor device operates. Since operation of cell strings may be directly and separately performed, the semiconductor device may perform efficiently a program operation, a read operation, and a verifying operation.

BRIEF DESCRIPTION OF THE DRAWINGS

The above and other features and advantages of the present invention will become readily apparent by reference to the following detailed description when considered in conjunction with the accompanying drawings wherein:

FIG. 3 is a flowchart illustrating a method of operating a semiconductor device according to one exemplary embodiment of the present invention;

FIG. 4 is a graph showing threshold voltages of dummy cells according to one exemplary embodiment of the present invention; and FIG. 5 is a diagram illustrating data of dummy cells and a voltage applied to a dummy line according to one exemplary embodiment of the present invention.

DESCRIPTION OF SPECIFIC EMBODIMENTS

Hereinafter, the preferred embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

Figure 1:
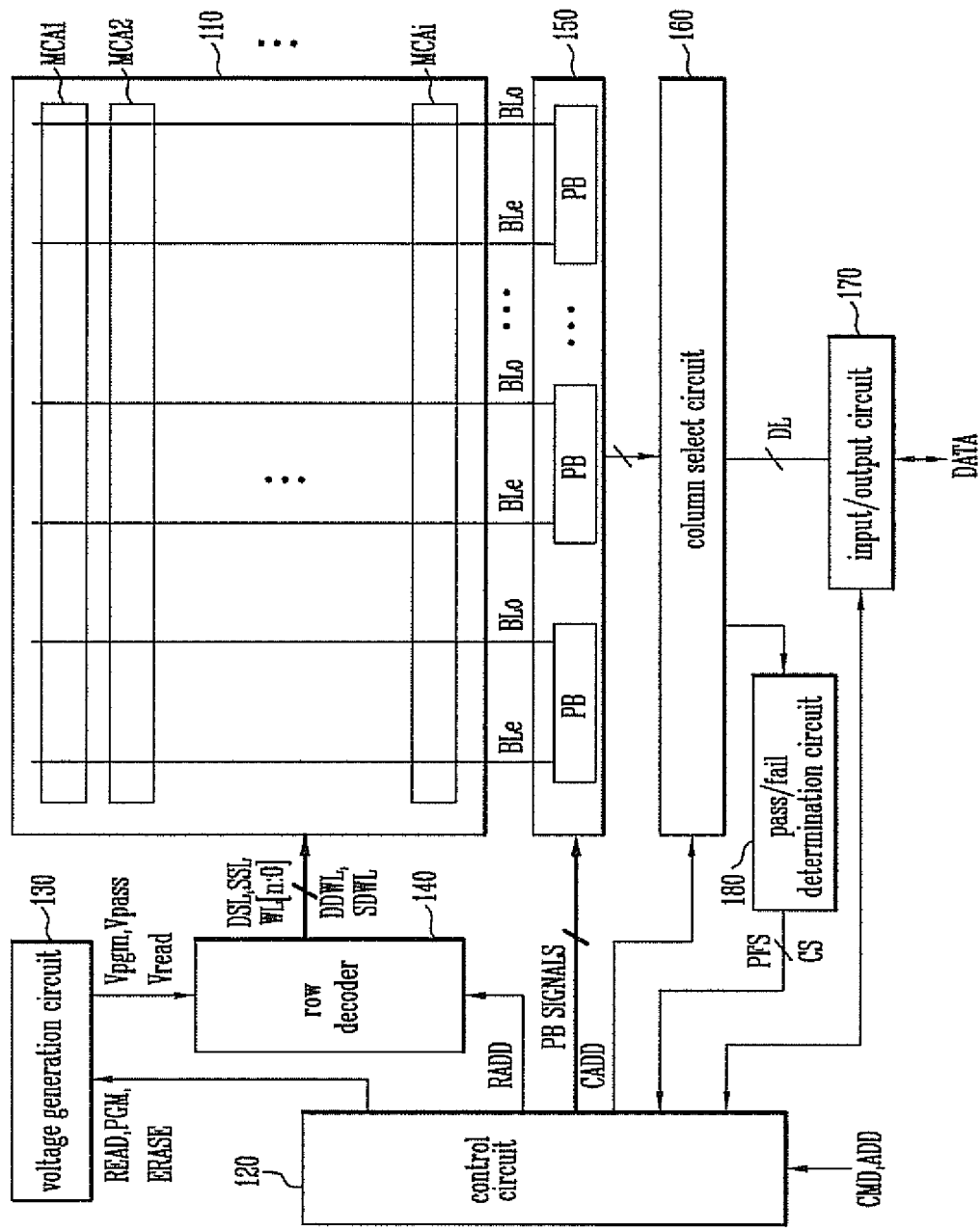
FIG. 1 is a block diagram illustrating a semiconductor device according to one exemplary embodiment of the present invention.

FIG. 1 is a block diagram illustrating a semiconductor device according to one exemplary embodiment of the present invention.

In FIG. 1, a semiconductor device includes a memory cell array 110, circuits 130, 140, 150, 160, 170 and 180 for performing a program operation, a read operation or an erase operation of memory cells in the memory cell array 110, and a control circuit 120 for controlling the circuits 130, 140, 150, 160, 170 and 180 to set threshold voltage levels of selected memory cells according to inputted data.

In case when the semiconductor device is an NAND flash memory device, the circuits include a voltage generation circuit 130, a row decoder 140, a page buffer circuit 150, a column select circuit 160, an input/output circuit 170, and a pass/fail determination circuit 180.

The memory cell array 110 includes cell blocks MCA1 to MCAi having memory cells in which data is stored, and the cell blocks MCA1 to MCAi share even bit lines BLe and odd bit lines BLo. That is, the even bit lines BLe are coupled to the other cell blocks MCA2 to MCAi as well as a first cell block MCA1. The odd bit lines BLo are also coupled to the other cell blocks MCA2 to MCAi as well as the first cell block MCA1. Accordingly, the even and the odd bit lines BLe and BLo are coupled to selected cell block according as a drain select transistor DST in FIG. 2 included in each of the cell blocks MCA1 to MCAi is turned on or turned off when the program operation, the read operation or the erase operation is performed.

The control circuit 120 outputs internally a program operation signal PGM, a read operation signal READ, or an erase operation signal ERASE, in response to a command signal CMD. The control circuit 120 outputs page buffer signals PB SIGNALS for controlling page buffers PB included in the page buffer circuit 150 according to kind of the operation. Additionally, the control circuit 120 outputs internally a row address signal RADD and a column address signal CADD in response to an address signal ADD. Furthermore, the control circuit 120 verifies whether or not threshold voltages of memory cells selected according to a check signal CS provided from the pass/fail determination circuit 180 increase up to a target level when a program verifying operation is performed. the control circuit 120 determines whether the program operation will be again performed or is completed according to the verified result.

A voltage supplying circuit 130 and 140 provides voltages needed for the program operation, the read operation or the erase operation to a drain select line DSL, a drain dummy line DDWL, word lines WL0 to WLn, a source dummy line SDWL and a source select line SSL according to the signals READ, PGM, ERASE and RADD of the control circuit 120. Specially, the voltage supplying circuit 130 or 140 determines a pass voltage applied to the drain dummy line DDWL and the source dummy line SDWL in accordance with data of dummy cells included in the cell blocks. The voltage supplying circuit 130 provides the determined pass voltage to corresponding dummy lines. The drain dummy line DDWL and the source dummy line SDWL are coupled to the dummy cells included in the cell blocks. This will be described in detail with reference to accompanying drawing FIG. 2. The voltage supplying circuit includes the voltage generation circuit 130 and the row decoder 140.

The voltage generation circuit 130 outputs operation voltages for programming, reading or erasing the memory cells to global lines in response to the operation signals PGM, READ and ERASE which are internal command signals of the control circuit 120. The voltage generation circuit 130 outputs operation voltages, e.g., Vpgm, Vpass and Vread, for programming to the global lines when the memory cells are programmed. In addition, the voltage generation circuit 130 applies a ground voltage to the word lines WL[n:0], or floats the word lines WL[n:0], when the erase operation is performed.

The row decoder 140 delivers the operation voltages generated from the voltage generation circuit 130 to local lines DSL, WL[n:0] and SSL and the dummy lines DDWL and SDWL of selected cell block in response to the row address signals RADD of the control circuit 120.

The page buffer circuit 150 includes page buffers PB coupled to the even bit lines BLe and the odd bit lines BLo, respectively. Each of the page buffers PB corresponds to a pair of bit lines, i.e., the even bit line BLe and the odd bit line BLo. The page buffer PB applies corresponding voltage to selected even or odd bit lines BLe or BLo in response to the page buffer signals PB SIGNALS outputted from the control circuit 120. Particularly, when the program operation, the read operation or the erase operation of the memory cells is performed, the page buffer circuit 150 precharges the even or the odd bit lines BLe or BLo, or latches data corresponding to threshold voltage level of the memory cells detected according to voltage change of the even or the odd bit lines BLe or BLo. That is, the page buffer circuit 150 applies a program tolerant voltage, e.g., ground voltage, or a program prohibition voltage, e.g., supply voltage, to the bit lines according to data inputted to a latch when the program operation is performed. The page buffer circuit 150 detects data stored in the memory cells by adjusting voltage of the even and the odd bit lines BLe and BLo in accordance with data stored in the memory cells when the read operation is performed.

The column select circuit 160 selects the page buffers PB included in the page buffer circuit 150 in response to the column address CADD outputted from the control circuit 120. Data latched to the page buffer PB selected by the column select circuit 160 is outputted to selected bit line.

The input/output circuit 170 delivers data DATA inputted from outside into the column select circuit 160 according to control of the control circuit 120, in order to input the data DATA to each of the page buffers PB1 to PBj of the page buffer circuit 150 when the program operation is performed. In case when the column select circuit 160 provides the delivered data in turn to the page buffers of the page buffer circuit 150, the page buffers store the inputted data in an internal latch. Additionally, the input/output circuit 170 outputs the data DATA, delivered from the page buffers of the page buffer circuit 150 through the column select circuit 160, to outside when the read operation is performed.

The pass/fail determination circuit 180 checks whether there is error cells having a threshold voltage which is smaller than a target level among programmed memory cells in the program verifying operation performed after the program operation. The pass/fail determination circuit 180 outputs the checked result as a check signal PFS. Furthermore, the pass/fail determination circuit 180 counts the number of the error cells to output the counted result as a counting signal CS. The control circuit 120 adjusts level of a program voltage applied to a word line selected when the program operation of the memory cells is performed. The control circuit 120 controls the voltage generation circuit 130 so that verification voltages are selectively applied to selected word lines when the program verifying operation is performed. Here, the control circuit 120 may control the voltage generation circuit 130 according to the counting signal CS of the pass/fail determination circuit 180.

Figure 2:
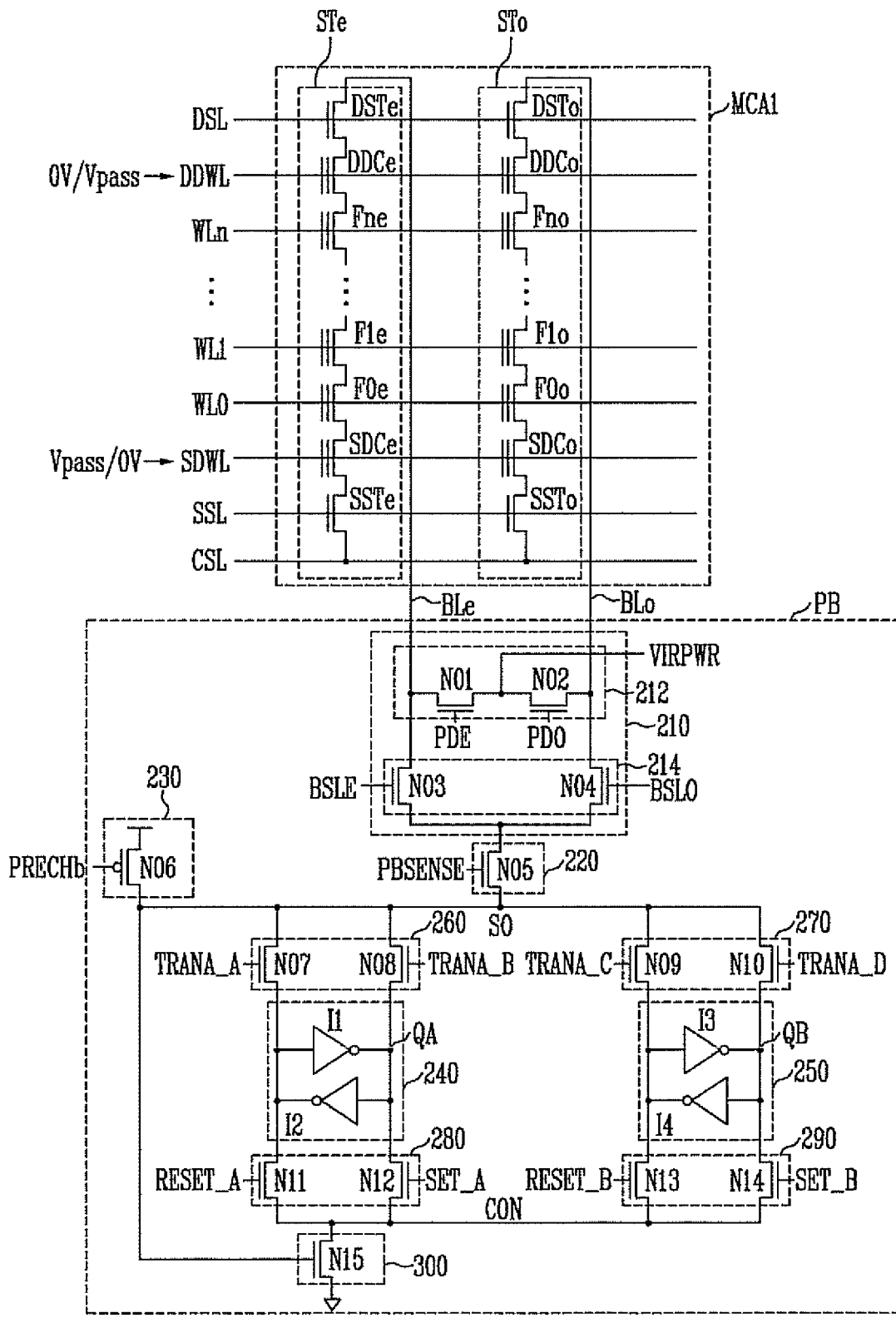
FIG. 2 is a circuit diagram illustrating a cell block and a page buffer shown in FIG. 1.

FIG. 2 is a circuit diagram illustrating a cell block and a page buffer shown in FIG. 1.

FIG. 2 shows one cell block MCA1 in FIG. 1 and corresponding page buffer PB. Each of the cell blocks has the same constitution. Each of the page buffers has the same constitution.

The first cell block MCA1 includes even cell strings STe and odd cell strings STo. Only one pair of the even and the odd cell strings STe and STo is shown in FIG. 2, but two or more event and odd cell strings Ste and STo are disposed in turn in each of the cell blocks. The even cell strings STe will be described in detail. The even cell string STe includes a source select transistor SST coupled to a common source line CSL, an even source dummy cell SDCe, memory cells F0 to Fn, an even drain dummy cell DDCe, and a drain select transistor DST coupled to even bit line BLe. The even source dummy cell SDCe may be one dummy cell coupled between the source select transistor SST and the memory cells F0 to Fn, or include plural dummy cells coupled in serial. Likewise, the even drain dummy cell DDCe may be one dummy cell coupled between the drain select transistor DDT and the memory cells F0 to Fn, or include plural dummy cells coupled in serial. The odd cell string STo may have the same constitution as the even cell string Ste. The dummy cells are referred to as the odd source dummy cell SDCo and the odd drain dummy cell DDCo, for convenience of description. A gate of the source select transistor SST is coupled to a source select line SSL. Gates of the source dummy cells SDCe and SDCo are coupled to a source dummy line SDWL. Each of gates of the memory cells F0 to Fn are coupled to word lines WL0 to WLn. A gate of the drain select transistor DST is coupled to a drain select line DSL. The even and the odd cell strings STe and STo are coupled between the odd and the even bit lines BLe and BLo corresponding thereto and the common source line CSL.

The page buffer PB includes a bit line select circuit 210 for selecting one of the even and the odd bit lines BLe or BLo, a sensing circuit 220 for delivering potential of the selected bit line to a sensing node SO or providing potential of the sensing node SO to the selected bit line, a precharge circuit 230 for precharging the sensing node SO, a first latch 240 and a second latch 250 for storing data, a first transmission circuit 260 for transmitting the data stored in the first latch 240 to the sensing node SO, a second transmission circuit 270 for transmitting the data stored in the second latch 250 to the sensing node SO, a first set/reset circuit 280 for setting up or resetting the first latch 150, a second set/reset circuit 290 of setting up or resetting the second latch 250, and a discharge circuit 300 for discharging a common node CON.

The bit line select circuit 210 includes a bit line precharge circuit 212 for precharging the even bit line BLe or the odd bit line BLo and a select circuit 214 for selecting the even bit line BLe or the odd bit line BLo.

The bit line precharge circuit 212 includes a first switch N01 for precharging the even bit line BLe in response to an even precharge signal PDE and a second switch N02 for precharging the odd bit line BLo in response to an odd discharge signal PDO. The first switch N01 includes an NMOS transistor coupled between the even bit line BLe and a terminal to which a virtual voltage VIRPWR is applied. The second switch N02 has an NMOS transistor coupled between the odd bit line BLo and the terminal to which the virtual voltage VIRPWR is applied. The virtual voltage VIRPWR is coupled to a power terminal. However, the virtual voltage may be coupled to the power terminal or a ground terminal according to kind of the semiconductor device to precharge of discharge coupled bit lines.

The select circuit 214 includes a third switch N03 for selecting the even bit line BLe in response to an even select signal BSLE and a fourth switch N04 of selecting the odd bit line BLo in response to the odd select signal BSLO. Each of the third switch N03 and the fourth switch N04 may be an NMOS transistor.

The sensing circuit 220 includes a fifth switch N05 for coupling selected bit line to the sensing node SO in response to a sensing signal PBSENSE. The fifth switch N05 may be an NMOS transistor.

The precharge circuit 230 includes a sixth switch N06 for coupling the power terminal to which a supply voltage Vcc is applied to the sensing node SO in response to a precharge signal PRECHb to precharge the sensing node SO. The sixth transistor N06 may be a PMOS transistor.

The first latch 240 includes a first inverter I1 and a second inverter I2. An output terminal of the first inverter I1 is coupled to an input terminal of the second inverter I2. An output terminal of the second inverter I2 is coupled to an input terminal of the first inverter I1.

The second latch 250 includes a third inverter I3 and a fourth inverter I4. An output terminal of the third inverter I3 is coupled to an input terminal of the fourth inverter I4. An output terminal of the fourth inverter I4 is coupled to an input terminal of the third inverter I3. The page buffer has only two latches 240 and 250 in FIG. 2, but the page buffer of the semiconductor device may include two or more latches.

The first transmission circuit 260 includes a seventh switch N07 for coupling the input terminal of the first inverter I1 to the sensing node SO in response to a first transmission signal TRANA_A and an eighth switch N08 for coupling the output terminal of the first inverter I1 to the sensing node SO in response to a second transmission signal TRANA_B. The seventh switch N07 and the eighth switch N08 may be NMOS transistors.

The second transmission circuit 270 includes a ninth switch N09 for coupling the input terminal of the third inverter I3 to the sensing node SO in response to a third transmission signal TRANA_C and a tenth switch N10 for coupling the output terminal of the third inverter I3 to the sensing node SO in response to a fourth transmission signal TRANA_D. The ninth switch N09 and the tenth switch N10 may be NMOS transistors.

The first set/reset circuit 280 includes an eleventh switch N11 for resetting the first latch 240 by coupling the output terminal of the second inverter I2 to the common node CON in response to a first reset signal RESET_A and a twelfth switch N12 for setting up the first latch 240 by coupling the input terminal of the second inverter I2 to the common node CON in response to a first set signal SET_A. The eleventh switch N11 and the twelfth switch N12 may be NMOS transistors.

The second set/reset circuit 290 includes a thirteenth switch N13 for resetting the second latch 250 by coupling the output terminal of the fourth inverter I4 to the common node CON in response to a second reset signal RESET_B and a fourteenth switch N14 for setting up the second latch 250 by coupling the input terminal of the fourth inverter I4 to the common node CON in response to a second set signal SET_B. The thirteenth switch N13 and the fourteenth switch N14 may be NMOS transistors.

The discharge circuit 300 includes a fifteenth switch N15 for discharging the common node CON by coupling the common node CON to the ground terminal Vss according to a voltage of the sensing node SO. The fifteenth switch N15 may be an NMOS transistor.

In case that the even cell string STe and the odd cell string STo operate separately, different voltages, e.g., a pass voltage Vpass or a ground voltage 0V, are applied to each of the drain dummy line DDWL and the source dummy line SDWL. In addition, in case when the even cell string STe and the odd cell string STo operate together, the pass voltage is applied to every of the drain dummy line DDWL and the source dummy line SDWL.

A method of operating the semiconductor device is as follows.

FIG. 3 is a flowchart illustrating a method of operating a semiconductor device according to one exemplary embodiment of the present invention.

(S01) The Step of Programming Dummy Cells

The dummy cells included in each of the cell blocks are programmed before a program operation, a read operation, or an erase operation of the semiconductor device is performed. Particularly, the operation of programming the dummy cells may be performed about every cell block before other operation (programming, reading, or erasing of memory cells) is performed after a power up operation of the semiconductor device is finished, or may be performed variably whenever a program operation or a read operation is performed about the cell block. The program operation of the dummy cells may be performed in every cell block or a selected cell block. Particularly, even bit lines are referred to as an even bit line. Odd bit lines are referred to as an odd bit line. A cell string corresponding to the even bit lines is referred to as an even cell string. A cell string corresponding to the odd bit lines is referred to as an odd cell string. The dummy cells included in the even cell string and the odd cell string may be divided into first dummy cells coupled between the drain select transistor and the memory cells and second dummy cells coupled between the source select transistor and the memory cells. A dummy cell included in the even cell string of the first dummy cells is referred to as an even drain dummy cell for convenience of description. A dummy cell included in the odd cell string of the first dummy cells is referred to as an odd drain dummy cell. In addition, a dummy cell included in the even cell string of the second dummy cells is referred to as an even source dummy cell. A dummy cell included in the odd cell string of the second dummy cells is referred to as an odd source dummy cell.

The even drain dummy cell and the odd source dummy cell are defined as one pair, and the odd drain dummy cells and the even source dummy cells are defined as another pair. Here, the dummy cells included in different pairs have different state. The dummy cells included in the same pair have the same state. For example, in case when the pair of the even drain dummy cell and the odd source dummy cell maintains erase state, the pair of the odd drain dummy cell and the even source dummy cell is programmed to have program state.

(S02) The Step of Applying the Pass Voltage to the Dummy Lines

In case when a program operation command, a read operation command, or a verifying operation command is inputted to the control circuit, the ground voltage of 0V or the pass voltage is applied to the dummy lines. Particularly, a dummy line coupled to the even and the odd drain dummy cells is defined as a drain dummy line. A dummy line coupled to the even and the odd source dummy cells is referred to as a source dummy line. When the even cell string and the odd cell string operate separately, the ground voltage and a pass voltage are respectively applied to the drain dummy line and the source dummy line, or the pass voltage and the ground voltage are respectively provided to the drain dummy line and the source dummy line according to data stored in the dummy cells. When the even cell string and the odd cell string operate simultaneously, the pass voltage is applied to every of the drain dummy line and the source dummy line.

(S03) The Step of Performing Selected Operation

After corresponding voltage is applied to each of the dummy lines, the selected operation (a program operation, a read operation, or a verifying operation) is performed according to a command inputted in the step S02.

In the above described method, the selected operation is performed after a part of the dummy cells corresponding to every cell block is programmed. However, the selected operation may be performed after one or plural specific cell blocks are selected. A part of the dummy cells corresponding to the selected cell block is programmed. Particularly, in case that one cell block is selected, an erase operation of the selected cell block is performed, a soft program and a verifying operation are performed about the erased cell block. A program operation is performed about the dummy cells. However, a method of programming the dummy cells may be variously modified.

FIG. 4 is a graph showing threshold voltages of dummy cells according to one exemplary embodiment of the present invention.

The dummy cells are programmed to have a threshold voltage distribution having a level lower than the pass voltage used in the program operation, the read voltage, the erase operation, or the verifying operation, when the program operation of the dummy cells is performed. For example, the pass voltage of approximately 4.5V is used in the read operation, and the pass voltage of about 9V is used in the program operation. Since the pass voltage is different depending on the operations, the threshold voltage of the dummy cells is based on lowest pass voltage. Accordingly, when lowest pass voltage is 4.5V, the program operation of the dummy cell is performed so that the threshold voltage of the dummy cells is smaller than 4.5V. Recently, a multi level cell MLC programmable to have various states has been widely used. For example, the multi level cell programmable to have one erase state and three program states is as follows. In case when three different program states are divided into a first program state, a second program state higher than the first program state and a third program greater than the second program state, the dummy cells may be programmed to the second program state. If the dummy cells are programmed to the first program state, reliability may be deteriorated because the threshold voltage of the dummy cells is adjacent to 0V. That is, to separate erased dummy cells and programmed dummy cells by applying 0V to the dummy line, malfunction may occur when the threshold voltage of the programmed dummy cells becomes low or the threshold voltage of the erased dummy cells increases. When the dummy cells are programmed to the third program state, a time for programming the dummy cells may increase due to high level of the threshold voltage. Accordingly, the dummy cells may be programmed to the second program state between the first program state and the third program state. Here, the threshold voltage of the dummy cells programmed to the second program state should not be higher than the pass voltage applied to the dummy line.

FIG. 5 is a diagram illustrating data of dummy cells and a voltage applied to a dummy line according to one exemplary embodiment of the present invention.

The even cell string and the odd cell string may operate separately or simultaneously according to data set of dummy cells and a voltage applied to the dummy lines. This will be described in detail with reference to accompanying drawings FIGS. 2 and 5.

A First Embodiment to Operate the Even Cell String and the Odd Cell String Separately The odd drain dummy cells DDCo and the even source dummy cells SDCe are programmed under the condition that the even drain dummy cells DDCe and the odd source dummy cells SDCo maintain erase state. Data of the erased dummy cells is referred to as "0". Data of the programmed dummy cells is defined as "1". As a result, each data of the even drain dummy cells DDCe and data of the odd source dummy cells SDCo is "0". Each data of the odd drain dummy cells DDCo and the even source dummy cells SDCe is "1".

To select the even cell strings STe, the ground voltage of 0V is applied to the drain dummy line DDWL and the pass voltage Vpass is provided to the source dummy line SDWL. The pass voltage Vpass applied to the dummy line is the same as a pass voltage provided to word lines not selected in each of the operation. For example, when the pass voltage applied to the word lines not selected in the read operation is 4.5V, the pass voltage of 4.5V is provided to the dummy line. In addition, if the pass voltage applied to word lines not selected in the program operation is 9V, the pass voltage of 9V is provided to the dummy line. When the ground voltage of 0V is applied to the drain dummy line DDWL, the even drain dummy cell DDCe is turned on because it is erase state ("0"), while the odd drain dummy cell DDCo is turned off because it is program state ("1"). Since current path between the odd cell string STo and the odd bit line BLo is blocked by odd drain dummy cell DDCo which is turned off, the odd cell string STo is not selected. When the pass voltage Vpass is applied to the source dummy line SDWL, every of the even source dummy cell SDCe and the odd source dummy cell SDCo is turned on irrespective of erase state or program state. Since every of the dummy cells DDCe and SDCe of the even cell string STe is turned on and the odd drain dummy cell DDCo of the odd cell string STo is turned off, the even cell string STe may be selected and corresponding operation may be performed about the selected even cell string STe.

To select the odd cell strings STo, the pass voltage is applied to the drain dummy line DDWL and the ground voltage of 0V is provided to the source dummy line SDWL. If the pass voltage is applied to the drain dummy line DDWL, every of the even drain dummy cell DDCe and the odd drain dummy cell DDCo is turned on irrespective of erase state or program state. When the ground voltage is applied to the source dummy line SDWL, the even source dummy cell SDCe is turned off because it is program state ("1"), while the odd source dummy cell SDCo is turned on because it is erase state ("0"). Current path between the even cell string STe and the common source line CSL is blocked by the even source dummy cell SDCe which is turned off. Since every of the dummy cells DDCo and SDCo of the odd cell string STo is turned on and the even source dummy cell SDCe of the even cell string STe is turned off, the odd cell string STo may be selected and corresponding operation may be performed about the selected odd cell string STo.

In the first embodiment, the ground voltage of 0V is applied to one of the drain dummy line DDWL and the source dummy line SDWL, current consumption of the semiconductor device may reduce compared to that of the conventional semiconductor device where the pass voltage is applied to every dummy line. Moreover, the other operations (program operation, read operation, or erase operation) may be performed under the condition that the dummy cells DDCe, DDCo, SDCe and SDCo are turned on or turned off like the first embodiment.

A Second Embodiment to Operate the Even Cell String and the Odd Cell String Separately The even drain dummy cells DDCe and the odd source dummy cells SDCo are programmed, while the odd drain dummy cells DDCo and the even source dummy cells SDCe maintain erase state. Data of the erased dummy cells is referred to as "0", while data of the programmed dummy cells is defined as "1". As a result, every data of the even drain dummy cells DDCe and data of the odd source dummy cells SDCo is "1", and every data of the odd drain dummy cells DDCo and the even source dummy cells SDCe is "0".

To select the even cell strings STe, the pass voltage Vpass is applied to the drain dummy line DDWL and the ground voltage of 0V is provided to the source dummy line SDWL. The pass voltage Vpass applied to the dummy line is the same as a pass voltage provided to word lines not selected in each of the operation. For example, when the pass voltage applied to the word lines not selected in the read operation is 4.5V, the pass voltage of 4.5V is provided to the dummy line. In addition, if the pass voltage applied to word lines not selected in the program operation is 9V, the pass voltage of 9V is provided to the dummy line. When the pass voltage Vpass is applied to the drain dummy line DDWL, the even drain dummy cell DDCe is turned on irrespective of erase state or program state. If the ground voltage of 0V is applied to the source dummy line SDWL, the even source dummy cell SDCe is turned on because it is erase state ("0"), while the odd source dummy cell SDCo is turned off when it is program state ("1"). Since current path between the odd cell string STo and the common source line CSL is blocked by the odd source dummy cell SDCo which is turned off. Since every of the dummy cells DDCe and SDCe of the even cell string STe is turned on and the odd source dummy cell SDCo of the odd cell string STo is turned off, the even cell string STe may be selected and corresponding operation may be performed about the selected even cell string STe.

To select the odd cell strings STo, the ground voltage of 0V is applied to the drain dummy line DDWL and the pass voltage Vpass is provided to the source dummy line SDWL. When the ground voltage of 0V is applied to the drain dummy line DDWL, every of the even drain dummy cell DDCe is turned off because it is program state ("1"), while the odd drain dummy cell DDCo is turned on because it is erase state ("0"). Since current path between the even cell string STe and the even bit line BLe is blocked by the even drain dummy cell DDCe which is turned off, the even cell string STe is not selected. If the pass voltage Vpass is applied to the source dummy line SDWL, every of the even source dummy cell SDCe and the odd source dummy cell SDCo is turned on irrespective of erase state or program state. Since every of the dummy cells DDCo and SDCo of the odd cell string STo is turned on and the even drain dummy cell DDCe of the even cell string STe is turned off, the odd cell string STo may be selected and corresponding operation may be performed about the selected odd cell string STo.

In the second embodiment, the ground voltage of 0V is applied to one of the drain dummy line DDWL and the source dummy line SDWL, current consumption of the semiconductor device may reduce compared to that of the conventional semiconductor device where the pass voltage is applied to every dummy line. Additionally, the other operations (program operation, read operation, or erase operation) may be performed under the condition that the dummy cells DDCe, DDCo, SDCe and SDCo are turned on or turned off like the second embodiment.

A Third Embodiment where the Even Cell String and the Odd Cell String are Not Separated To operate simultaneously the even cell string STe and the odd cell string STo without separated, the pass voltage is applied to the dummy lines DDWL and SSWL irrespective of program state of erase state of the even drain dummy cells DDCe, the odd source dummy cells SDCo, the odd drain dummy cells DDCo, and the even source dummy cells SDCe. That is, when the pass voltage is applied to the drain dummy line DDWL, every of the even drain dummy cell DDCe and the odd drain dummy cell DDCo is turned on irrespective of program state or erase state. Furthermore, when the pass voltage is applied to the source dummy line SDWL, every of the even source dummy cell SDCe and the odd source dummy cell SDCo is turned on irrespective of program state or erase state. Accordingly, since area of blocking current path by the dummy cells does not occur, the even cell string STe and the odd cell string STo may operate simultaneously without separated. Moreover, the other operations (program operation, read operation, or erase operation) may be performed under the condition that the dummy cells DDCe, DDCo, SDCe and SDCo are turned on like the third embodiment.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A method of operating a semiconductor device, the method comprising:
    programming an even drain dummy cell and maintaining an even source dummy cell to erase state in an even cell string coupled between an even bit line and a common source line and including a drain select transistor, the even drain dummy cell, memory cells, the even source dummy cell and a source select transistor coupled in serial;
    maintaining an odd drain dummy cell and an odd source dummy cell to erase state in an odd cell string coupled between an odd bit line and the common source line and including a drain select transistor, the odd drain dummy cell, memory cells, the odd source dummy cell and a source select transistor coupled in serial; and
    coupling selected cell string to selected bit lines and blocking connection of a cell string not selected and bit lines not selected by applying a ground voltage to a drain dummy line coupled to the even and the odd drain dummy cells or a source dummy line coupled to the even and the odd source dummy cells.

2. The method of claim 1, wherein the step of programming the even drain dummy cell and the odd source dummy cell is performed before a program operation, a read operation, or an erase operation of the memory cells is performed.

3. The method of claim 1, wherein the programmed even drain dummy cell and the odd source dummy cell have threshold voltage between 0V and a pass voltage smallest among pass voltages applied to unselected word lines in the program operation, the read operation or the erase operation of the memory cells.

4. The method of claim 3, wherein the programmed even drain dummy cell and the odd source dummy cell are programmed to a second program state of erase state of the memory cells, a first program state, the second program state higher than the first program state and a third program state greater than the second program state.

5. The method of claim 1, wherein the step of programming the even drain dummy cell and the odd source dummy cell is performed about every memory cell block in which the even odd cell string and the odd cell string is included, or is performed about selected memory cell block of the memory cell blocks.

6. The method of claim 1, wherein an operation of erasing every of the even and the odd drain dummy cells in the even and the odd cell strings, the even and the odd source dummy cells and the memory cells is performed before the even drain dummy cell and the odd source dummy cell are programmed.

7. The method of claim 1, wherein a pass voltage is applied to the drain dummy line and a ground voltage is provided to the source dummy line to select the even cell string when the program operation, the read operation or the erase operation of the memory cells is performed.

8. The method of claim 7, wherein the pass voltage is the same as a pass voltage applied to a word line not selected when various operations are performed about the memory cells.

9. The method of claim 1, wherein a ground voltage is applied to the drain dummy line and a pass voltage is provided to the source dummy line to select the odd cell string when the program operation, the read operation or the erase operation of the memory cells is performed.

10. The method of claim 1, wherein a pass voltage is applied to the even and the odd dummy lines to select every cell string when the program operation, the read operation or the erase operation of the memory cells is performed.

11. A method of operating a semiconductor device, comprising:
    selecting an odd bit lines or an even bit lines, for one of program and read operations;
    making dummy cells, coupled to the selected bit lines be in an erase state and other dummy cells coupled to unselected bit lines be in program state; and
    coupling the selected bit lines to selected cell strings and blocking connection between the unselected bit lines and unselected cell strings by applying a ground voltage to a dummy line coupled to the dummy cells.

12. The method of claim 11, wherein the step of making dummy cells coupled to unselected bit lines of the dummy cells to program state is performed before a power up operation of the semiconductor device is finished and a program operation, a read operation or an erase operation of the memory cells is performed.

13. The method of claim 11, wherein the dummy cells having program state has a threshold voltage between 0V and a pass voltage smallest among pass voltages applied to unselected word lines when the program operation, the read operation and the erase operation of the memory cells are performed.

14. The method of claim 13, wherein the dummy cells having program state are programmed to a second program state among an erase state of the memory cells, a first program state, the second program state higher than the first program state and a third program state greater than the second program state.

15. The method of claim 11, wherein the step of making dummy cells coupled to unselected bit lines of the dummy cells to program state is performed about every memory cell block included in the semiconductor device or is a memory cell block selected from the memory cell blocks.

16. The method of claim 11, further comprising:
erasing every of the dummy cells and the memory cells in the cell string before the step of making dummy cells coupled to unselected bit lines of the dummy cells to program state is performed.

17. The method of claim 11, wherein a ground voltage is applied to a dummy line coupled to the dummy cells after making a dummy cell of a cell string corresponding to the odd bit line to erase state and making a dummy cell of a cell string corresponding to the even bit line to program state, to select the cell string corresponding to the odd bit line when the program operation, the read operation, or an erase operation of the memory cells is performed.

18. The method of claim 17, wherein a pass voltage is applied to the dummy line to select every cell string when the program operation, the read operation, or the erase operation of the memory cells is performed.

19. The method of claim 11, wherein a ground voltage is applied to a dummy line coupled to the dummy cells after making a dummy cell of a cell string corresponding to the odd bit line to program state and making a dummy cell of a cell string corresponding to the even bit line to erase state, to select the cell string corresponding to the even bit line when the program operation, the read operation or an erase operation of the memory cells is performed.

20. A semiconductor device comprising:
a control circuit configured to output a program operation signal, a read operation signal or an erase operation signal in response to a command signal and an address;
memory cell blocks including an even and an odd cell strings having a drain select transistor, a drain dummy cell, memory cells, a source dummy cell, and a source select transistor coupled in serial, wherein some of the dummy cells are programmed and others of the dummy cells maintain erase state; and
a voltage supplying circuit configured to provide voltages needed for program operation, a read operation or an erase operation of the memory cells to a drain select line coupled to the drain select transistor, a source select line coupled to the source select transistor, word lines coupled to the memory cells and dummy lines coupled to the dummy cells, determine a pass voltage applied to the drain dummy line and the source dummy line according to data of the dummy cells, and provide the determined pass voltage or a ground voltage to each of the dummy lines.

21. The semiconductor device of claim 20, wherein dummy cells coupled between the drain select transistor and the memory cells of the dummy cells included in the even cell strings are even drain dummy cells, dummy cells coupled between the memory cells and the source select transistor of the dummy cells are even source dummy cells,
dummy cells coupled between the drain select transistor and the memory cells of the dummy cells included in the odd cell strings are odd drain dummy cells, and dummy cells coupled between the memory cells and the source select transistor of the dummy cells are odd source dummy cells.

22. The semiconductor device of claim 21, wherein the dummy cells have
a first state where the even drain dummy cells and the odd source dummy cells are programmed, and the odd drain dummy cells and the even source dummy cells maintain erase state, or
a second state where the even drain dummy cells and the odd source dummy cells maintain erase state, and the odd drain dummy cells and the even source dummy cells are programmed.

23. The semiconductor device of claim 20, wherein the pass voltage provided to the dummy lines is the same as a pass voltage applied to word lines not selected in the program operation, the read operation or the erase operation of the memory cells.

24. The semiconductor device of claim 23, wherein the programmed dummy cells have a threshold voltage between 0V and a pass voltage smallest among pass voltages applied to the word line not selected in the program operation, the read operation or the erase operation of the memory cells.

* * * * *